United States Patent
Hausdorf et al.

(10) Patent No.: US 7,734,268 B2
(45) Date of Patent: Jun. 8, 2010

(54) METHOD AND APPARATUS FOR LEVELING AN INCREASING OR DECREASING SLOPE OF AN AM MODULATED RECEIVING SIGNAL

(75) Inventors: Reiner Hausdorf, Ottobrunn (DE); Leo Brueckner, Prstice (CZ)

(73) Assignee: Rohde & Schwarz GmbH & Co. KG, München (DE)

( * ) Notice: Subject to any disclaimer, the term of this patent is extended or adjusted under 35 U.S.C. 154(b) by 539 days.

(21) Appl. No.: 11/694,397

(22) Filed: Mar. 30, 2007

(65) Prior Publication Data

US 2007/0275678 A1    Nov. 29, 2007

(30) Foreign Application Priority Data

Apr. 7, 2006  (EP) .................................. 06007405
May 12, 2006 (EP) .................................. 06009866

(51) Int. Cl.
    *H04B 7/00*    (2006.01)
(52) U.S. Cl. ................. 455/252.1; 455/127.2; 455/323; 330/254; 330/278
(58) Field of Classification Search ............. 455/232.1, 455/127.2, 252.1, 234.1, 245.1, 250.1, 323.1; 330/252, 254, 278
    See application file for complete search history.

(56) References Cited

U.S. PATENT DOCUMENTS

| | | | |
|---|---|---|---|
| 6,240,100 B1 | 5/2001 | Riordan et al. | |
| 6,684,065 B2 * | 1/2004 | Bult et al. | ................. 455/252.1 |
| 6,744,320 B2 * | 6/2004 | Nguyen et al. | ............... 330/254 |
| 7,106,388 B2 * | 9/2006 | Vorenkamp et al. | ......... 348/726 |
| 2003/0114126 A1 | 6/2003 | Wang et al. | |
| 2003/0219085 A1 | 11/2003 | Endres et al. | |

FOREIGN PATENT DOCUMENTS

DE       196 10 455       10/1997
DE       199 37 199        2/2001
WO    WO 2004/038953 A1    5/2004

OTHER PUBLICATIONS

European Search Report for Application No. 06009866.2, dated Oct. 27, 2006.

* cited by examiner

*Primary Examiner*—Tony T Nguyen
(74) *Attorney, Agent, or Firm*—Marshall, Gerstein & Borun LLP

(57) ABSTRACT

A method and an apparatus for leveling an increasing or decreasing slope of an AM modulated receiving signal attenuate the AM modulated receiving signal with an attenuation curve with a stepwise slope corresponding to the increasing or decreasing slope of said AM modulated receiving signal, filters the attenuated AM modulated receiving signal within AM-demodulation with a lowpass infinite-impulse-response filter of at least second order and increases the level of each delay-unit's output signal of the infinite-impulse-response filter each time a step in the attenuated AM modulated receiving signal arrives at the input of said infinite-impulse-response filter.

9 Claims, 6 Drawing Sheets

(state of the art)

(state of the art)

(state of the art)

Fig. 5B invention

Fig. 5A state of the art

METHOD AND APPARATUS FOR LEVELING AN INCREASING OR DECREASING SLOPE OF AN AM MODULATED RECEIVING SIGNAL

BACKGROUND OF THE INVENTION

1. Field of the Invention

The invention relates to a method and an apparatus for leveling an increasing or decreasing slope of an AM modulated receiving signal.

2. Related Technology

In an amplitude modulated receiver—AM receiver—the level of an amplitude modulated receiving signal is controlled by means of an automatic gain control (AGC) for adapting the receiving signal to the predetermined signal range in the signal path.

The receiving signal is fed through a (pre-)amplifier 1 according to FIG. 1. The level of the (pre-) amplified receiving signal is measured by a subsequent RF level detector 2. The automatic gain control 3 determines the suitable attenuation value for the radio-frequency receiving signal. Adjusted by means of the automatic gain control 3 the radio-frequency-attenuator (RF attenuator) 4 attenuates the receiving signal for ensuring a suitable signal level at the broadband mixer 5 input.

The mixer 5 supplied with a carrier signal from a local oscillator 6 converts the receiving radio frequency signal to intermediate-frequency (IF) range. The intermediate-frequency signal is bandpass filtered for a subsequent narrowband analog-digital-converter 10 by means of an intermediate-frequency filter 7.

The level of the intermediate-frequency receiving signal is measured by a subsequent IF level detector 8. The automatic gain control 3 determines the suitable attenuation value for the intermediate-frequency receiving signal. Receiving the determined attenuation value from the automatic gain control 3 the intermediate-frequency-attenuator (IF attenuator) 9 attenuates the receiving signal for ensuring a suitable signal level at the (narrowband) analog-digital-converter 10 input.

After analog-digital-converting the attenuated digital receiving signal is frequency shifted to the baseband by means of a digital-down-converter 11 sourced with a carrier signal from a numerically controlled oscillator 12. Finally the baseband receiving signal is filtered and demodulated in an AM demodulator 13. In the AM demodulator 13 the time average $DC(m(n))$ of the amplitude $m(n)$ of the complex attenuated baseband receiving signal $x(n)$ is determined by lowpass filtering of the amplitude $m(n)$ of the complex attenuated baseband receiving signal $x(n)$ in a lowpass infinite-impulse-response filter 14.

In a subtracting unit 15 the difference between the amplitude $m(n)$ of the complex attenuated baseband receiving signal $x(n)$ and the time average $DC(m(n))$ of the amplitude $m(n)$ of the complex attenuated baseband receiving signal $x(n)$ is calculated, which is scaled with the time average $DC(m(n))$ of the amplitude $m(n)$ of the complex attenuated baseband receiving signal $x(n)$ in a subsequent scaler 16 for generating the AM demodulated receiving signal $y(n)$ corresponding to equation (1).

$$y(n) = \frac{m(n) - DC(m(n))}{DC(m(n))} \quad (1)$$

For cost and performance reasons the RF and IF attenuator 4 and 8 are usually realized as step attenuators exhibiting only discrete levels of attenuation, for example 1-12 dB in 1 dB steps as in curve 1 of FIG. 2.

A RF receiving signal with an increasing and/or decreasing slope—curve 2 in FIG. 2—is transformed by such an attenuation to an attenuated RF receiving signal with smaller increasing and/or decreasing slope segments connected each other by step segments. Curve 3 in FIG. 2 shows the amplitude $m(n)$ of the complex attenuated baseband receiving signal $x(n)$ at the output of the digital-down-converter 10.

The subsequent AM demodulator creates the demodulated signal $y(n)$ from the attenuated baseband receiving signal $x(n)$. In principle the AM demodulation is performed corresponding to equation (1) by determining the time average $DC(m(n))$ of the amplitude $m(n)$, subtracting the time average $DC(m(n))$ from the amplitude $m(n)$ and normalizing the difference by dividing through the time average $DC(m(n))$ of the amplitude $m(n)$.

The time average $DC(m(n))$ of the amplitude $m(n)$ of the complex attenuated baseband receiving signal $x(n)$ is determined by means of a lowpass infinite-impulse-response filter. The order of the lowpass infinite-impulse-response filter is normally at least two—typically four—and therefore the lowpass infinite-impulse-response filter, if activated by an step in the signal at its input, generates oscillations. The signal at the output of the lowpass infinite-impulse-response filter representing the time average $DC(m(n))$ of the amplitude $m(n)$ of the complex attenuated baseband receiving signal $x(n)$ is characterized by oscillations in case of steps in the amplitude $m(n)$ of the complex attenuated baseband receiving signal $x(n)$, as can be seen in curve 1 of FIG. 3.

These oscillations are transferred to the output signal $y(n)$ of the AM demodulation (curve 2 of FIG. 3). In case of a audio signal as receiving signal the oscillations in the output signal $y(n)$ can be heard as unwanted clicks.

A receiver with an AGC-controller and a predictive offset correction is known from U.S. Pat. No. 6,240,100 B1 referred to as background art.

SUMMARY OF THE INVENTION

The invention provides a method and an apparatus, which level an increasing or decreasing slope of an AM modulated receiving signal and which avoid oscillations—heard as unwanted clicks—in the signal after demodulation of the AM modulated receiving signal.

According to the invention, a method for leveling an increasing or decreasing slope of an AM modulated receiving signal includes the steps of: attenuating the AM modulated receiving signal with an attenuation curve with a stepwise slope corresponding to the increasing or decreasing slope of the AM modulated receiving signal, filtering the attenuated AM modulated receiving signal with a lowpass filter having at least one delay unit within AM-demodulation, and increasing the level of the output signal of each delay unit of the lowpass filter each time a step in said attenuated AM modulated receiving signal arrives at the input of the lowpass filter and modulating the steps of leveling comprising increasing the level of each output signal in an amount of the step in the attenuation curve causing said step in said attenuated AM modulated receiving signal arriving at the input of said lowpass filter.

Also according to the invention, an apparatus for leveling an increasing or decreasing slope of an AM modulated receiving signal includes an attenuator for attenuating the receiving signal corresponding to an attenuation curve, an automatic gain control measuring the receiving signal control and generating the attenuation curve with a stepwise slope to the increasing or decreasing slope of the receiving signal, a lowpass filter within an AM-demodulator filtering the attenuated receiving signal, and a delay buffer for delaying a control signal signaling each step in the attenuated receiving signal for the delay time of the attenuated receiving signal from the attenuator to the lowpass filter.

BRIEF DESCRIPTION OF THE DRAWINGS

An embodiment of the invention is shown in the drawings and is consecutively described in detail. In the drawings:

FIGS. 5A and 5B show a table of the level transition of several signals in the lowpass IIR-filter of state of the art and the inventive apparatus for leveling an increasing or decreasing slope of an AM modulated receiving signal.

DETAILED DESCRIPTION

According to the invention, the signals at the output of each delay-unit of the lowpass infinite-impulse-response filter are increased each time a step in the amplitude m(n) of the complex attenuated baseband receiving signal x(n) arriving at the input of the lowpass infinite-impulse-response filter. The increasing of each of these delay-unit output signals is dependent on the respective step in the attenuation curve causing the step in the amplitude m(n) of the complex attenuated baseband receiving signal x(n).

The increasing of each of these delay-unit output signals for one sampling instance guarantees a negative feedback in the canonical structure of the lowpass infinite-impulse-response filter and thus oscillations in the feedback structure of the lowpass infinite-impulse-response filter can be avoided.

The lowpass infinite-impulse-response filter is informed about the time occurring a step in the attenuated receiving signal using a control signal sc generated from the automatic gain control being responsible for the attenuation of the receiving signal. The delay time between the stepwise attenuation of the receiving signal in the attenuator and the compensation of the steps in the attenuated receiving signal in the lowpass infinite-impulse-response filter caused by means of processing units between the attenuator and the lowpass infinite-impulse-response filter, i.e. the delay caused by an analog-digital-converter and a digital-down-converter, is taken into account by a delay buffer delaying the control signal generated from the automatic gain control.

Before describing the inventive apparatus and the inventive method for leveling an increasing or decreasing slope of an AM modulated receiving signal according to FIG. 6 to 9, the principle of function of an IIR filter of fourth order in case of a negative step in the attenuated receiving signal entering the IIR filter is presented in the state of the art in comparison with the invention.

Figure 4:
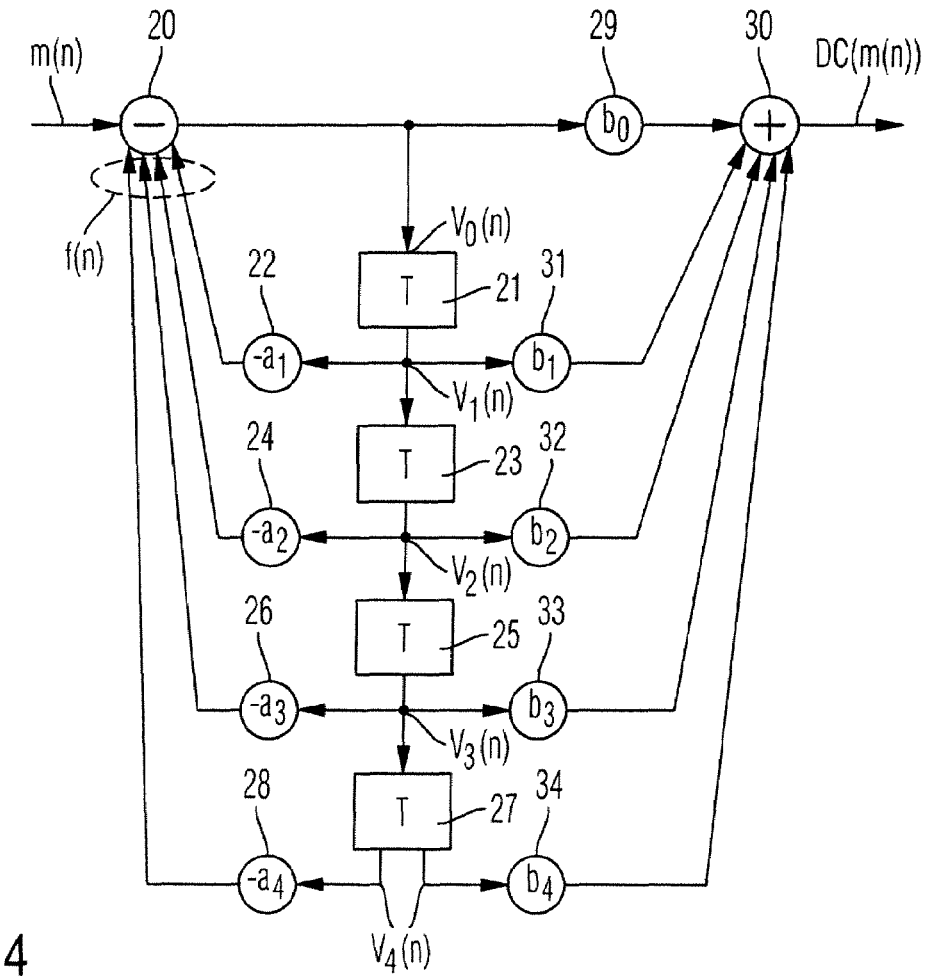
FIG. 4 shows a diagram of a lowpass infinite-impulse-response filter of fourth order in canonical structure of the prior art.

A lowpass infinite-impulse-response filter of fourth order in canonical structure is presented in FIG. 4.

The feedback signal f(n) is subtracted from the amplitude m(n) of the complex attenuated baseband receiving signal x(n) in a subtracting unit 20. The feedback signal f(n) comprises the output signal $V_1(n)$ of the first delay unit 21, which is weighted with the filter coefficient −a1 in the multiplier 22, the output signal $V_2(n)$ of the second delay unit 23, which is weighted with the filter coefficient −a2 in the multiplier 24, the output signal $V_3(n)$ of the third delay unit 25, which is weighted with the filter coefficient −a3 in the multiplier 26, and the output signal $V_4(n)$ of the fourth delay unit 27, which is weighted with the filter coefficient −a4 in the multiplier 28.

The output signal $V_0(n)$ of the subtracting unit 20 is fed to the input of the first delay unit 21 and also to the multiplier 29 for weighting with the filter coefficient b0. In the summing unit 30 the signal $V_0(n)$ weighted with the filter coefficient b0 is added to the output signal $V_1(n)$ of the first delay unit 21, which is weighted with the filter coefficient $b_1$ in the multiplier 31, to the output signal $V_1(n)$ of the second delay unit 23, which is weighted with the filter coefficient $b_2$ in the multiplier 32, to the output signal $V_3(n)$ of the third delay unit 25, which is weighted with the filter coefficient $b_3$ in the multiplier 33, and to the output signal $V_4(n)$ of the fourth delay unit 27, which is weighted with the filter coefficient $b_4$ in the multiplier 34.

The filter coefficients $a_1$, $a_2$, $a_3$, $a_4$, $b_0$, $b_1$, $b_2$, $b_3$, and $b_4$ of the IIR filter in FIG. 4 are parameterized for a lowpass characteristic. Therefore the signal DC(m(n)) at the output of the IIR filter—at the output of the summing unit 30—represents the time average of the amplitude m(n) of the complex attenuated baseband receiving signal x(n) at the input of the IIR filter.

Figure 2:
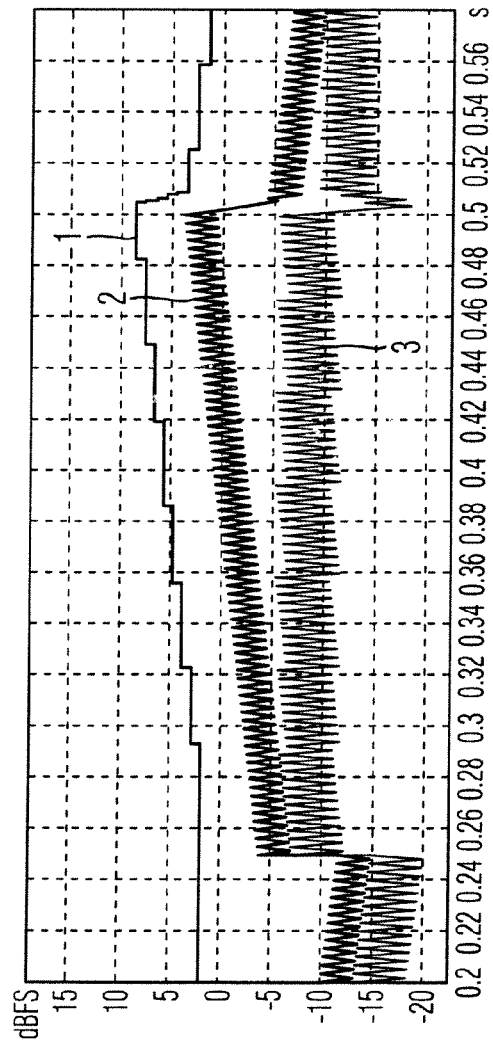
FIG. 2 shows a time diagram of the stepwise attenuation curve, of the RF receiving signal and of the amplitude of the complex attenuated baseband receiving signal.
Figure 3:
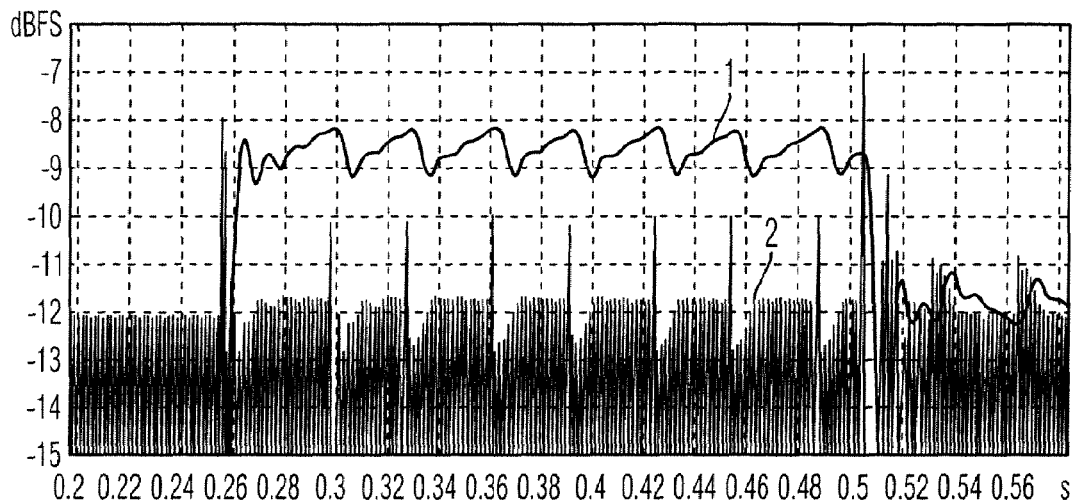
FIG. 3 shows a time diagram of the signal at the output of a lowpass infinite-impulse-response filter of state of the art representing the time average of the amplitude of the complex attenuated baseband receiving signal and of the signal at the output of an AM demodulator of the prior art.
Figures 5A, 5B:
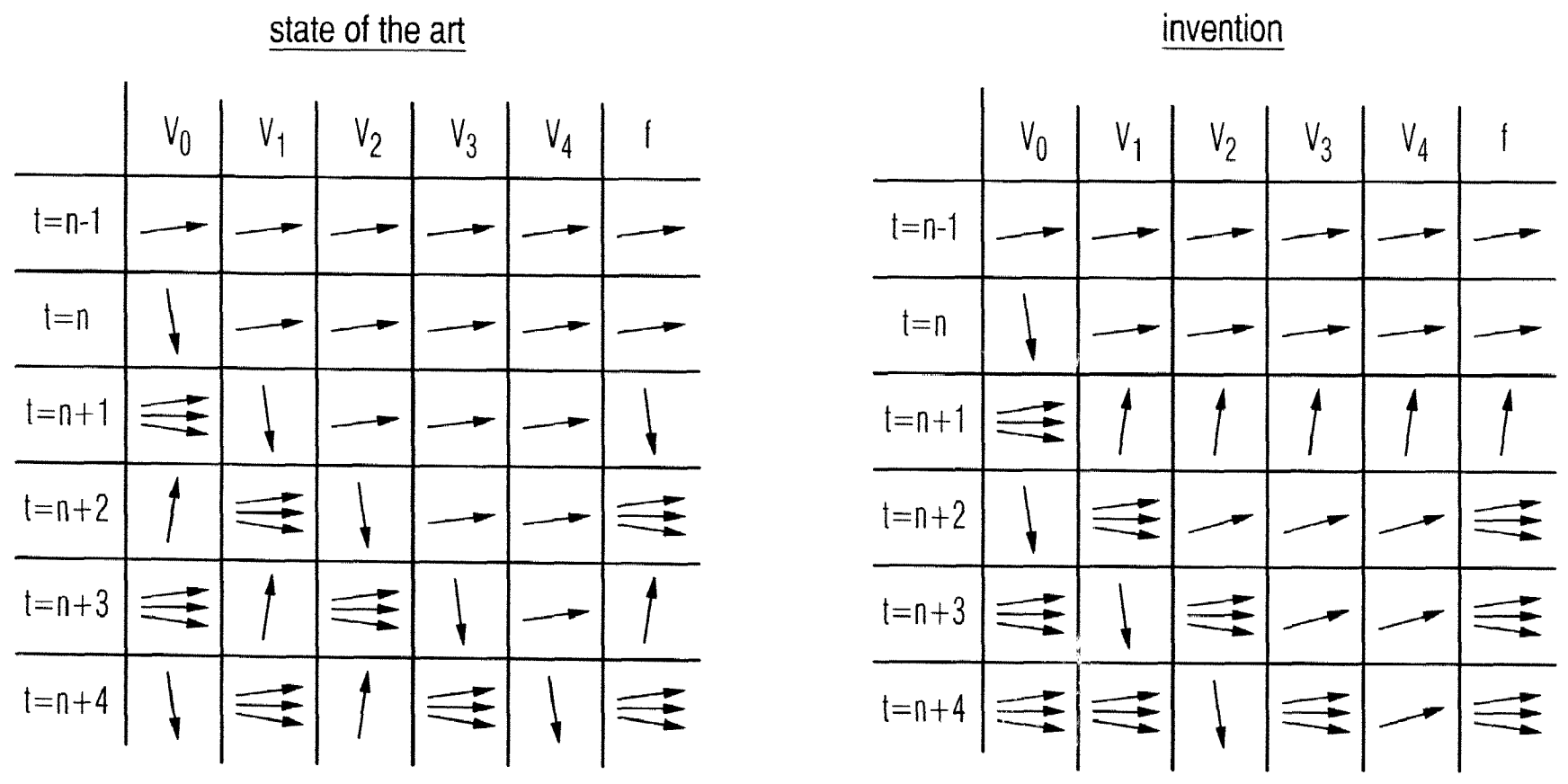

The behavior of such an IIR filter as state of the art in case of an increasing slope segment in the amplitude m(n) of the complex attenuated baseband receiving signal x(n) followed by a negative step segment corresponding to curve 3 of FIG. 2 is presented in FIG. 5A.

At time t=n−1 the level of the signal $V_0$ at the input of the first delay unit 21, of the signal $V_1$ at the output of the first delay unit 21, of the signal $V_2$ at the output of the second delay unit 22, of the signal $V_3$ at the output of the third unit 23, of the signal $V_4$ at the output of the fourth unit 24 and of the feedback signal f(n) increases slightly in comparison with the respective Level at the former time t=n−2.

At time t=n the level of the signal V0 decreases significantly depending on the negative step segment in the amplitude m(n) of the complex attenuated baseband receiving signal x(n). The level of the signals $V_1$, $V_2$, $V_3$, and $V_4$ at the output of the respective delay unit 21, 23, 25, and 27 overtake the level of the signals $V_0$, $V_1$, $V_2$, and $V_3$ at the input of the respective delay unit 21, 23, 25, and 27 from time t=n−1.

Therefore the level of the signals $V_1$, $V_2$, $V_3$, and $V_4$ increases slightly in comparison with former time t=n−1. The level of the feedback signal f(n) as the sum of the levels of signals $V_1$, $V_2$, $V_3$, and $V_4$ weighted with the corresponding filter coefficient $a_1$, $a_2$, $a_3$, and $a_4$ increases slightly in the same manner.

At time t=n+1 the level of the amplitude m(n) of the complex attenuated baseband receiving signal x(n) increases slightly from the lowest level. Therefore the level of the signal V0 at the input of the delay unit 21 as difference between the level of the amplitude m(n) of the complex attenuated baseband receiving signal x(n) and the level of the feedback signal f(n) at former time t=n increases or decreases slightly or remains constantly independent from the values of the filter coefficients $a_1$, $a_2$, $a_3$ and $a_4$. The level of signals $V_1$, $V_2$, $V_3$, and $V_4$ at the output of the respective delay unit 21, 23, 25, and 27 overtakes the level of the signals $V_0$, $V_1$, $V_2$, and $V_3$ at the input of the respective delay unit 21, 23, 25, and 27 from time t=n. The decreasing of the level of signal $V_1$ is significantly larger than the increasing of the level of each signal $V_2$, $V_3$ and $V_4$. Therefore the level of feedback signal f(n) decreases significantly independently of the values of the filter coefficients $a_1$, $a_2$, $a_3$, and $a_4$.

At time t=n+2 the level of the amplitude m(n) of the complex attenuated baseband receiving signal x(n) increases slightly, whereas the level of feedback signal f(n) at former time t=n+1 decreases significantly. Therefore the level of signal $V_0$ at the input of the delay unit 21 as difference between the amplitude m(n) of the complex attenuated baseband receiving signal x(n) at time t=n+2 and the feedback signal f(n) at former time t=n+1 increases significantly. The level of signals $V_1$, $V_2$, $V_3$, and $V_4$ at the output of the respective delay unit 21, 23, 25, and 27 overtakes the level of signals $V_0$, $V_1$, $V_2$, and $V_3$ at the input of the respective delay unit 21, 23, 25, and 27 from time t=n+1. The level of feedback signal f(n) increases or decreases slightly or remains constantly in comparison with the respective level at former time t=n+1, because the sum of increases and decreases of signals $V_1$, $V_2$, $V_3$, and $V_4$—especially with respect to the size of their slopes—weighted with the corresponding filter coefficients $a_1$, $a_2$, $a_3$, and a4 is not significantly different between time t=n+1 and t=n+2 independently of the values of the filter coefficients $a_1$, $a_2$, $a_3$, and $a_4$.

At time t=n+3 the level of the amplitude m(n) of the complex attenuated baseband receiving signal x(n) increases slightly, whereas the level of feedback signal f(n) at former time t=n+2 increases or decreases slightly or remains constantly. Therefore the level of signal V0 at the input of the delay unit 21 as difference between the amplitude m(n) of the complex attenuated baseband receiving signal x(n) at time t=n+3 and the feedback signal f(n) at former time t=n+2 increases or decreases significantly or remains constantly. The level of signals $V_1$, $V_2$, $V_3$, and $V_4$ at the output of the respective delay unit 21, 23, 25, and 27 overtakes the levels of signals $V_0$, $V_1$, $V_2$, and $V_3$ at the input of the respective delay unit 21, 23, 25, and 27 from time t=n+2. The level of feedback signal f(n) increases significantly in comparison with the respective level at former time t=n+2 independent from the values of the filter coefficients $a_1$, $a_2$, $a_3$, and $a_4$, because the sum of increases and decreases of signals $V_1$, $V_2$, $V_3$, and $V_4$—especially with respect to the size of their slopes— contains at time t=n+3 one significantly increasing of one of signals $V_1$, $V_2$, $V_3$, and $V_4$ more than the sum of increases and decreases of signals $V_1$, $V_2$, $V_3$, and $V_4$—especially with respect to the size of their slopes—at time t=n+2.

At time t=n+4 the level of the amplitude m(n) of the complex attenuated baseband receiving signal x(n) increases slightly, whereas the level of feedback signal f(n) at former time t=n+3 increases significantly. Therefore the level of signal $V_0$ at the input of the delay unit 21 as difference between the amplitude m(n) of the complex attenuated baseband receiving signal x(n) at time t=n+4 and the feedback signal f(n) at former time t=n+3 decreases significantly. The level of signals $V_1$, $V_2$, $V_3$, and $V_4$ at the output of the respective delay unit 21, 23, 25, and 27 overtakes the levels of signals $V_0$, $V_1$, $V_2$, and $V_3$ at the input of the respective delay unit 21, 23, 25, and 27 from time t=n+3. The level of feedback signal f(n) increases or decreases slightly or remains constantly in comparison with the respective level at former time t=n+3, because the sum of increases and decreases of signals $V_1$, $V_2$, $V_3$, and $V_4$—especially with respect to the size of their slopes—weighted with the corresponding filter coefficients $a_1$, $a_2$, $a_3$ and $a_4$ is not significantly different between time t=n+4 and t=n+3 independently of the values of the filter coefficients a1, $a_2$, $a_3$, and $a_4$.

The positive feedback—significant decreasing of feedback signal f(n) at time t=n+1—resulting from the negative step in the amplitude m(n) of the complex attenuated baseband receiving signal x(n) produces a continuous decreasing or increasing of the level of signals $V_0$, $V_1$, $V_2$, $V_3$, and $V_4$ at the input and also at the output of each delay unit 21, 23, 25, and 27 of the IIR filter. These oscillations in signals $V_0$, $V_1$, $V_2$, $V_3$, and $V_4$ can be identified in FIG. 5A in column 1 for signal $V_0$, in column 2 for signal $V_1$ and in column 3 for signal $V_2$.

The behavior of an IIR filter in an inventive apparatus for leveling an increasing or decreasing slope of an AM modulated receiving signal in case of an increasing slope segment in the amplitude m(n) of the complex attenuated baseband receiving signal x(n) followed by a negative step segment corresponding to curve 3 of FIG. 2 is presented in FIG. 5B.

The levels of signals $V_0$, $V_1$, $V_2$, $V_3$, and $V_4$ and their slopes at time t=n−1 and time t=n are identical to those in the IIR filter of the state of the art.

At time t=n+1 the levels of signals $V_1$, $V_2$, $V_3$, and $V_4$ are increased significantly corresponding to the step in the attenuation curve causing the step in the attenuated receiving signal arriving at the input of the IIR filter. Therefore the level of feedback signal f(n) as sum of the levels of signals $V_1$, $V_2$, $V_3$, and $V_4$ weighted with the corresponding filter coefficients $a_1$, $a_2$, $a_3$, and $a_4$ increases significantly.

At time t=n+2 the level of the amplitude m(n) of the complex attenuated baseband receiving signal x(n) increases slightly, whereas the level of feedback signal f(n) at former time t=n+1 increases significantly. Therefore the level of signal $V_0$ at the input of the delay unit 21 as difference between the amplitude m(n) of the complex attenuated baseband receiving signal x(n) at time t=n+2 and the feedback signal f(n) at former time t=n+1 decreases significantly. The level of signals $V_1$, $V_2$, $V_3$, and $V_4$ at the output of the respective delay unit 21, 23, 25, and 27 overtakes the level of the signals $V_0$, $V_1$, $V_2$, and $V_3$ at the input of the respective delay unit 21, 23, 25, and 27 from time t=n+1. Therefore the level of signal $V_1$ increases or decreases slightly or remains constantly, whereas the level of signal $V_2$, $V_3$, and $V_4$ increases moderate. The level of feedback signal f(n) increases slightly or moderately or decreases slightly or remains constantly in comparison with the respective level at the former time t=n+1 dependent from the values of the filter coefficients $a_1$, $a_2$, $a_3$, and $a_4$.

At time t=n+3 the level of the amplitude m(n) of the complex attenuated baseband receiving signal x(n) increases slightly, whereas the level of feedback signal f(n) at former time t=n+2 increases slightly or moderately or decreases slightly or remains constantly. Therefore the level of signal $V_0$ at the input of the delay unit 21 as difference between the amplitude m(n) of the complex attenuated baseband receiving signal x(n) at time t=n+3 and the feedback signal f(n) at former time t=n+2 increases slightly or decreases slightly or moderately or remains constantly. The level of signals $V_1, V_2, V_3$, and $V_4$ at the output of the respective delay unit 21, 23, 25, and 27 overtakes the level of signals $V_0, V_1, V_2$, and $V_3$ at the input of the respective delay unit 21, 23, 25, and 27 from time t=n+2. The level of feedback signal f(n) as sum of the levels of signals $V_1, V_2, V_3$, and $V_4$ weighted with the corresponding filter coefficients $a_1, a_2, a_3$, and $a_4$ increases or decreases slightly or moderately or remains constantly in comparison with the respective level at former time t=n+2 dependent from the values of the filter coefficients $a_1, a_2, a_3$, and $a_4$.

At time t=n+4 the level of the amplitude m(n) of the complex attenuated baseband receiving signal x(n) increases slightly, whereas the level of feedback signal f(n) at former time t=n+3 increases or decreases slightly or moderately or remains constantly. Therefore the level of signal $V_0$ at the input of the delay unit 21 as difference between the amplitude m(n) of the complex attenuated baseband receiving signal x(n) at time t=n+4 and the feedback signal f(n) at former time t=n+3 increases slightly or decreases slightly or moderately or remains constantly. The level of signals $V_1, V_2, V_3$, and $V_4$ at the output of the respective delay unit 21, 23, 25, and 27 overtakes the levels of signals $V_0, V_1, V_2$, and $V_3$ at the input of the respective delay unit 21, 23, 25, and 27 from time t=n+3. The level of feedback signal f(n) as sum of the levels of signals $V_1, V_2, V_3$, and $V_4$ weighted with the corresponding filter coefficients $a_1, a_2, a_3$, and $a_4$ increases or decreases slightly or remains constantly in comparison with the respective level at former time t=n+3 dependent from the values of the filter coefficients $a_1, a_2, a_3$, and $a_4$.

The negative feedback—significant increasing of feedback signal f(n) at time t=n+1—resulting from the inventive increasing of the signals $V_1, V_2, V_3$, and $V_4$ at time t=n+1 in consequence of the step in the amplitude m(n) of the complex attenuated receiving signal x(n) at the input of the IIR filter 14 at time t=n guarantees a stabilization of the IIR filter 14 without oscillations. The behavior of the signals $V_0, V_1, V_2, V_3, V_4$, and f(n) is approximately smooth and is characterized only by slight or moderate increases or decreases or constancy (see especially the behavior of the signal $V_0, V_1$, and f at time t=n+3, t=n+4).

Figure 6:
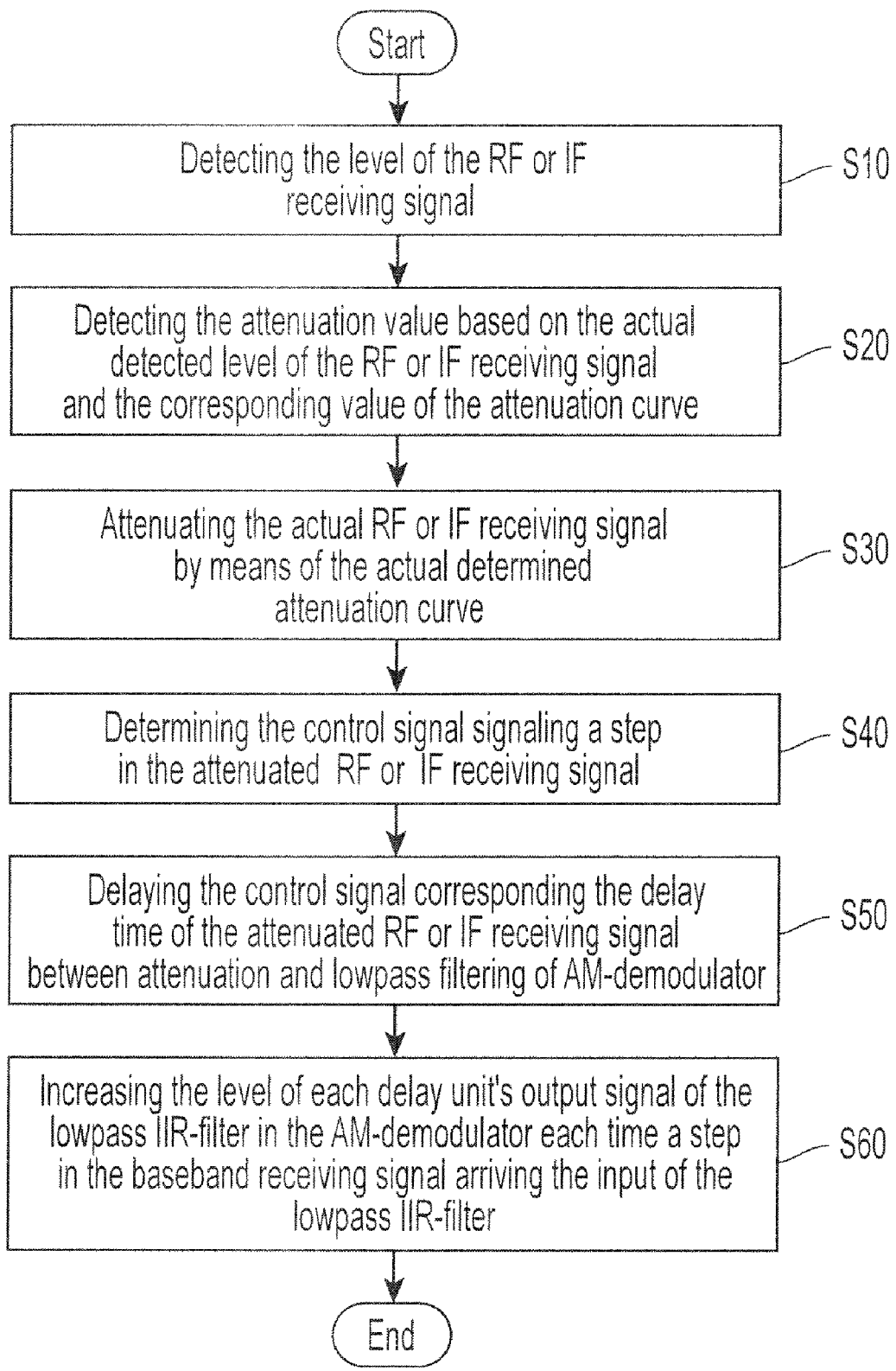
FIG. 6 shows a flowchart of the inventive method for leveling an increasing or decreasing slope of an AM modulated receiving signal.

In FIG. 6 the inventive method for leveling an increasing or decreasing slope of an AM modulated receiving signal is shown.

In step S10 the level of the radio-frequency AM modulated receiving signal is measured by the RF level detector 2 and the level of the intermediate-frequency AM modulated receiving signal is measured by the IF level detector 8.

In the following step S20 the automatic gain control 3 determines based on the detected level of the RF receiving signal the corresponding RF attenuation value. Based on the detected level of the IF receiving signal, the automatic gain control 3 determines the corresponding IF attenuation value.

In the following step S30 the RF modulated receiving signal is attenuated with the determined RF attenuation value by the RF attenuator 4, and the IF AM modulated receiving signal is attenuated with the determined IF attenuation value the IF attenuator 9.

In case of an increasing or decreasing AM modulated receiving signal—an approximating or departing mobile radio unit to or from the basestation, respectively—the time of a step in the attenuation is identified in the following step S40 by the automatic gain control 3. The automatic gain control 3 generates a control signal sc signaling a step in the attenuated RF or IF receiving signal for the IIR filter 14 in the AM demodulator 13'.

In the following step S50 the control signal sc is delayed by a delay buffer 17 corresponding to the delay time of the attenuated RF receiving signal between the RF attenuator and the lowpass IIR filter 14 in the AM demodulator 13'. The control signal sc is also delayed by the delay buffer 17 corresponding to the delay time of the IF receiving signal between the the IF attenuator 9 and the lowpass IIR filter 14 in the AM demodulator 13'.

Depending on the information in the delayed control signal sc signaling a step in the attenuated RF receiving signal or the IF receiving signal the level of each delay unit's output signal $V_1, V_2, V_3$, and $V_4$ of the lowpass IIR filter 14 in the AM demodulator 13' is increased in the last step S60 corresponding to equation (2).

$$V_k(n) = V_k(n-1) \cdot 10^{\frac{A(n)-A(n-1)}{20}} \quad k = 1, \ldots, 4 \qquad (2)$$

Here the variable A(n−1) is the value of the attenuation curve before the step and A(n) is the value of the attenuation curve after the step.

Figure 7:
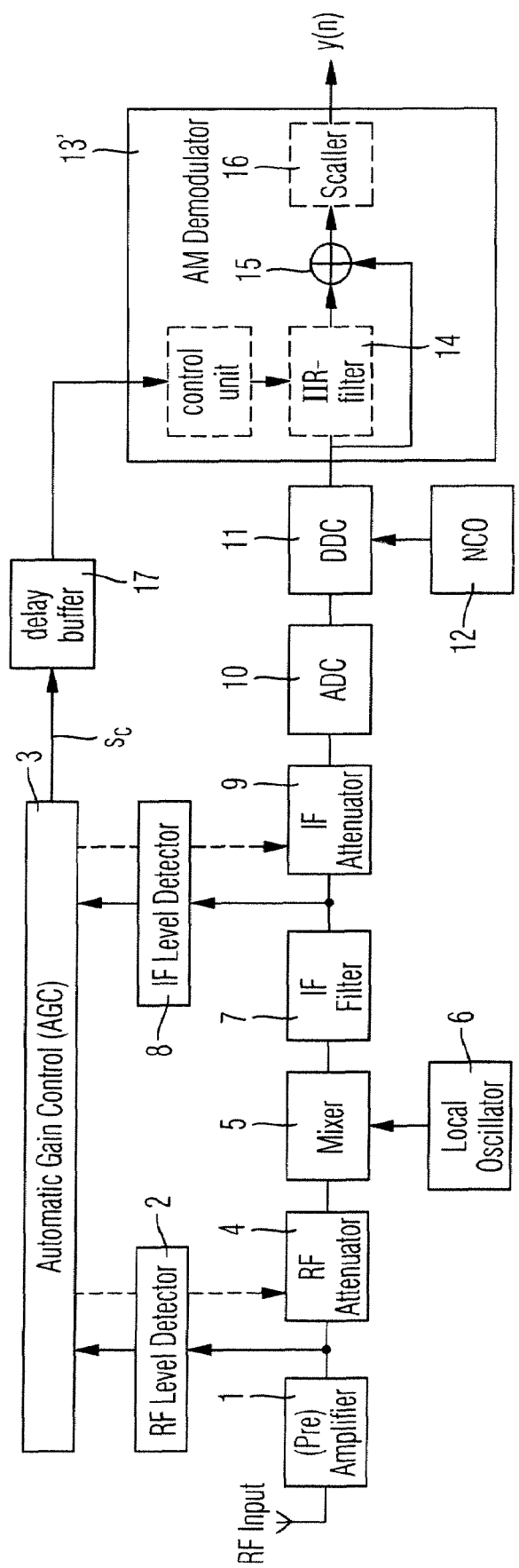
FIG. 7 shows a diagram of the inventive apparatus for leveling an increasing or decreasing slope of an AM modulated receiving signal.

The inventive apparatus for leveling an increasing or decreasing slope of an AM modulated receiving signal is shown in FIG. 7.

Figure 1:
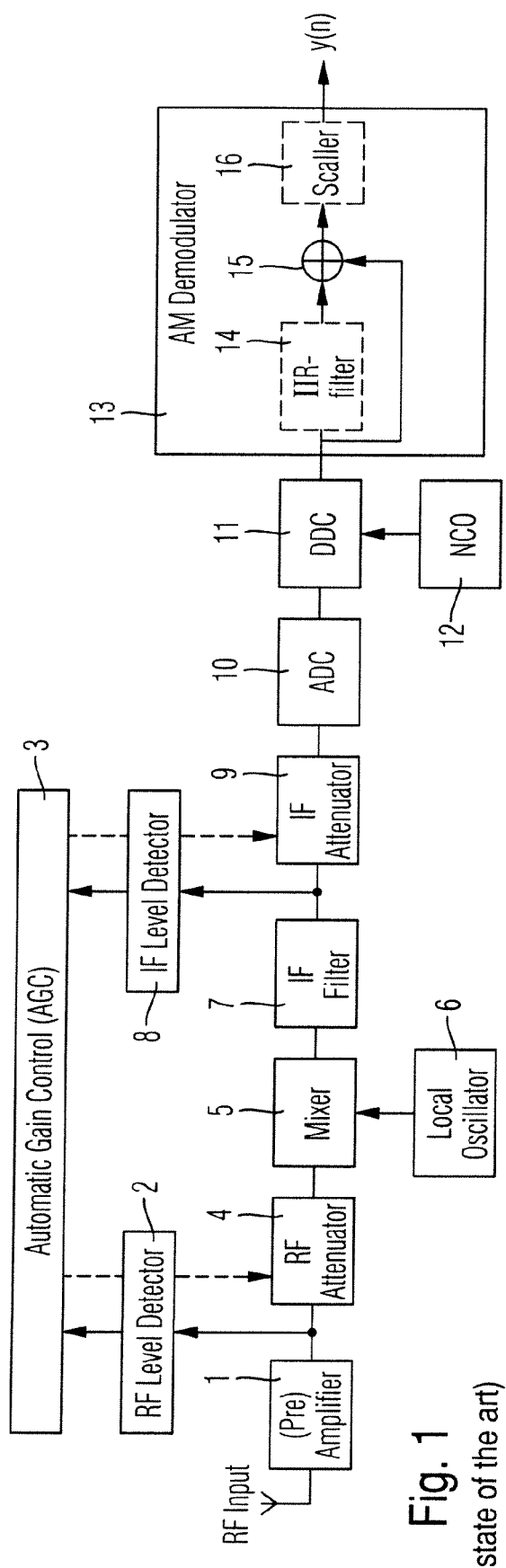
FIG. 1 shows a diagram of an apparatus for leveling an increasing or decreasing slope of an AM modulated receiving signal of the prior art.

Identical features of the inventive apparatus for leveling an increasing or decreasing slope of an AM modulated receiving signal in FIG. 7 and of the apparatus for leveling an increasing or decreasing slope of an AM modulated receiving signal of state of the art in FIG. 1 have identical reference numbers and are not described repetitively.

In the inventive apparatus for leveling an increasing or decreasing slope of an AM modulated receiving signal the automatic gain control 3 generates a control signal sc signaling a step in the attenuated RF AM modulated receiving signal or the IF AM modulated receiving signal. The control signal sc signaling a step in the attenuated RF or IF AM modulated receiving signal is delayed in the delay buffer 17 corresponding to the delay time of the attenuated RF or IF AM modulated receiving signal between the RF attenuator 4 or the IF attenuator 9, respectively, and the lowpass IIR filter 14.

In the inventive AM demodulator 13' a control unit 18 receives the delay control signal $s_c$ and increases the signals $V_1, V_2, V_3$, and $V_4$ at the output of the respective delay unit each time the delayed control signal $s_c$ contains an information signaling a step in the attenuated RF or IF AM modulated receiving signal.

Figure 8:
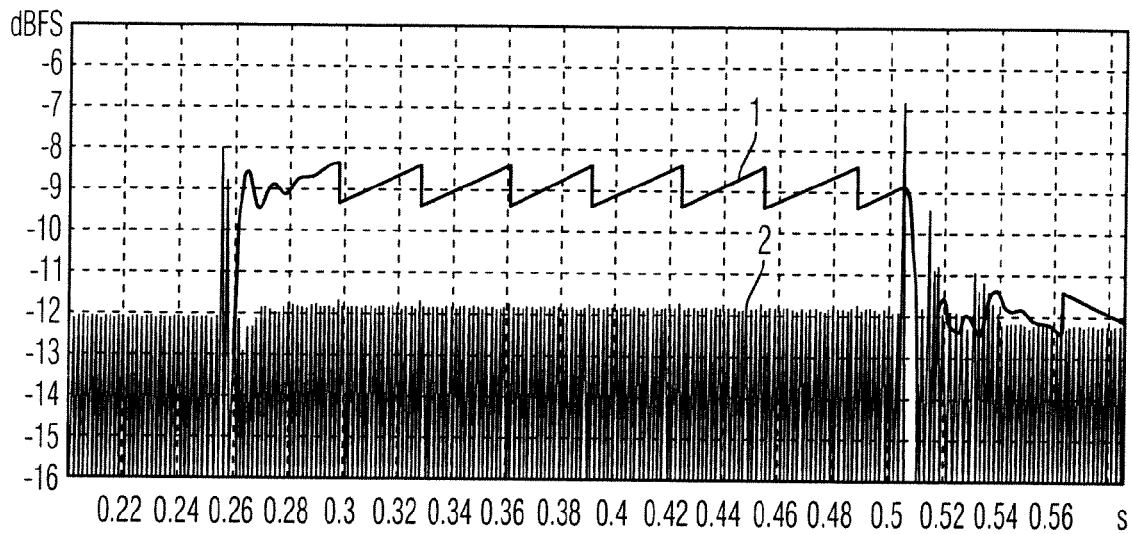
FIG. 8 shows a time diagram of the signal at the output of the lowpass IIR filter and at the output of the AM demodulator of the inventive apparatus for leveling an increasing or decreasing slope of an AM modulated receiving signal.

For comparison with the state of the art the time average DC(m(n)) of the amplitude m(n) of the complex baseband AM modulated receiving signal x(n) at the output of the lowpass IIR filter 14 and the signal y(n) at the output of the AM demodulator 13' of the inventive apparatus for leveling an increasing or decreasing slope of an AM modulated receiving signal is displayed in curve 1 and 2 of FIG. 8. After appearing a step in the attenuated RF or IF receiving signal no or minimal oscillations can be identified in the time average DC(m(n)) of the amplitude m(n) of the complex baseband AM modulated receiving signal x(n) at the output of the lowpass IIR filter 14 and in the signal y(n) at the output of the AM demodulator 13' of the inventive apparatus for leveling an increasing or decreasing slope of an AM modulated receiving signal.

Figure 9:
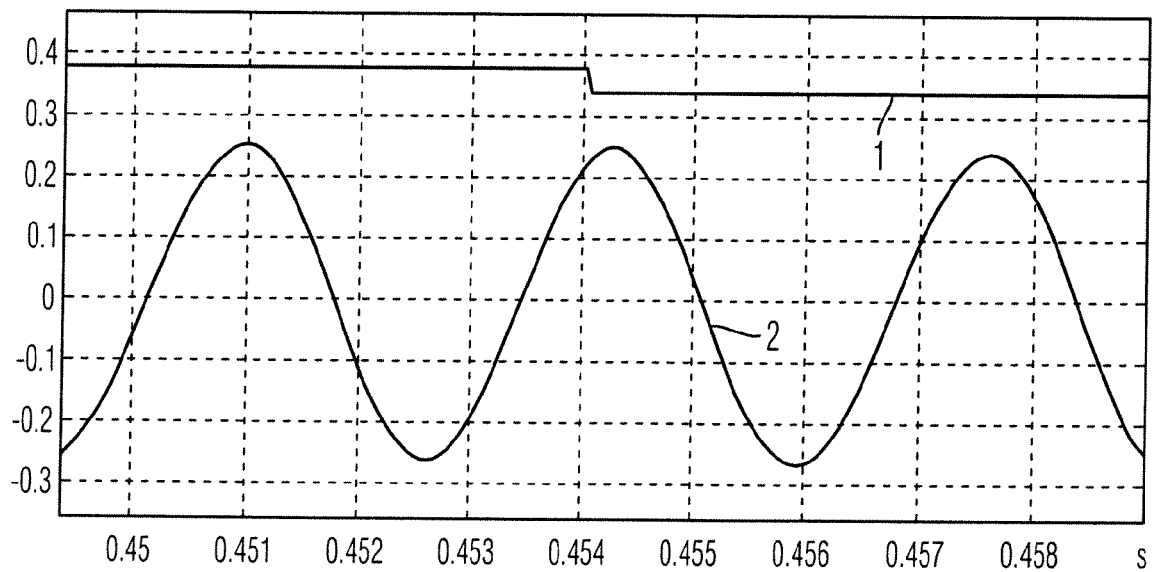
FIG. 9 shows a time diagram of the stepwise attenuation curve and of the signal at the output of the AM demodulator of the inventive apparatus for leveling an increasing or decreasing slope of an AM modulated receiving signal.

In more detail FIG. 9 shows in curve 1 a negative step in the attenuation curve and in curve 2 the resulting signal y(n) at the output of the AM demodulator 13'. A superposition of a further oscillation to the AM demodulated signal y(n) cannot be detected.

The invention is not limited to the described embodiment. Especially a separated increasing of each signal at the respective delay unit's output in case of arriving of the step in the attenuated receiving signal at the respective delay unit of the IIR filter is covered by the invention.

The invention claimed is:

1. Method for leveling an increasing or decreasing slope of an AM modulated receiving signal comprising the following steps:
- attenuating the AM modulated receiving signal with an attenuation curve with a stepwise slope corresponding to the increasing or decreasing slope of the AM modulated receiving signal,
- filtering the attenuated AM modulated receiving signal with a lowpass filter having at least one delay unit within AM-demodulation, and
- increasing the level of the output signal of each delay unit of the lowpass filter each time a step in said attenuated AM modulated receiving signal arrives at the input of the lowpass filter (14).

2. Method for leveling of claim 1,
wherein the lowpass filter is an infinite-impulse-response filter of at least second order.

3. Method for leveling of claim 1,
comprising increasing the level of each output signal in an amount of the step in the attenuation curve causing said step in said attenuated AM modulated receiving signal arriving at the input of said lowpass filter.

4. Method for leveling of claim 1, wherein the lowpass filter is an infinite-impulse-response filter of fourth order.

5. Apparatus for leveling an increasing or decreasing slope of an AM modulated receiving signal comprising:
- an attenuator for attenuating said receiving signal corresponding to an attenuation curve,
- an automatic gain control measuring said receiving signal control and generating said attenuation curve with a stepwise slope corresponding to said increasing or decreasing slope of said receiving signal,
- a lowpass filter within an AM-demodulator filtering said attenuated receiving signal, and
- a delay buffer for delaying a control signal signaling each step in said attenuated receiving signal for the delay time of said attenuated receiving signal from said attenuator to said lowpass filter.

6. Apparatus of claim 5,
wherein said lowpass filter is a infinite-impulse-response filter of at least second order.

7. Apparatus of claim 5, wherein said lowpass filter is a fourth order digital filter in canonical structure.

8. Apparatus of claim 5,
wherein said AM-demodulator subtracts the lowpass filtered attenuated receiving signal, which is filtered by said lowpass filter, from said attenuated receiving signal.

9. Apparatus of claim 5,
wherein said attenuated receiving signal is delayed between said attenuator and said lowpass filter by means of an analog-to-digital-converter and a digital-down-converter.

* * * * *